(12) United States Patent
Poss et al.

(10) Patent No.: US 6,396,358 B1
(45) Date of Patent: May 28, 2002

(54) DUAL-CONTROL RING VOLTAGE CONTROLLED OSCILLATOR

(75) Inventors: Joey Martin Poss, Rochester, MN (US); Scott Kevin Reynolds, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/773,338

(22) Filed: Jan. 31, 2001

(51) Int. Cl.[7] ................................................. H03B 5/24
(52) U.S. Cl. ........................ 331/57; 331/34; 331/36 C; 331/177 R; 331/177 V
(58) Field of Search ............................ 331/34, 36, 57, 331/177 R, 177 V, 179

(56) References Cited

U.S. PATENT DOCUMENTS

| | | | |
|---|---|---|---|
| 4,884,041 A | 11/1989 | Walker | 331/57 |
| 5,191,301 A | 3/1993 | Mullgrav, Jr. | 331/57 |
| 5,668,505 A | * 9/1997 | Vu et al. | 331/49 |
| 5,789,989 A | 8/1998 | Paschal et al. | 331/57 |
| 5,847,617 A | * 12/1998 | Reddy et al. | 331/57 |

* cited by examiner

Primary Examiner—David Mis
(74) Attorney, Agent, or Firm—Karuna Ojanen (57) ABSTRACT

A circuit of a dual control voltage-controlled ring oscillator is disclosed having significantly less power and area while still maintaining a large frequency range and tune accuracy. The dual control ring oscillator has at least two delay paths which can be added or interpolated according to an interpolation variable set by a coarse tune and a fine tune code. In addition, moreover, each of the delay paths have a number of variable delay elements which are varied in response to another input code. When the variable delay elements are capacitors, the capacitance will be varied in accordance with another coarse tune code. In the preferred embodiment, the input codes are digital and the frequency range obtained can be greater than two to one. First, the variable delay elements are adjusted to obtain coarse tuning of the dual control ring oscillator then the interpolation variable is more finely adjusted to obtain fine tuning of the ring oscillator. Phase control can be similarly accomplished using coarse tuning by adjusting the delay of the paths, and then using fine tuning to interpolate the delay paths.

14 Claims, 9 Drawing Sheets

DUAL-CONTROL RING VOLTAGE CONTROLLED OSCILLATOR

FIELD OF THE INVENTION

The present invention relates generally to the field of voltage controlled oscillators, and more particularly, the invention is directed to a dual-control ring voltage controlled oscillator having a frequency range greater than two to one and a method to tune its frequency.

BACKGROUND OF THE INVENTION

A voltage controlled oscillator (VCO) is simply a circuit that generates an oscillating signal at a frequency controlled by a voltage supplied from an external source. VCOs are basic building blocks of many electronic systems especially phase-locked loops and may be found in computer disk drives, wireless electronic equipment such as cellular telephones, and other systems having an oscillation frequency controlled by an applied tuning voltage. One basic design for a VCO is the ring oscillator.

Ring oscillators have a number of delay stages of amplifiers wherein the amount of delay of each stage is controlled by an input voltage or current. The input voltage can be further controlled by varying the capacitance of each stage. The output of the Nth stage is coupled to the input of the first stage. The ring oscillator's frequency is inversely proportional to twice the total delay. Very high frequencies can be obtained with ring oscillators by decreasing the delay and decreasing the number of delay stages, but the oscillators are susceptible to noise and jitter. Ring oscillators, depending on the phase noise requirement, will probably require much less power and area than inductor capacitor (LC) oscillators or the multivibrator oscillators and, as a result, are often used in computer disk drive applications. It is particularly useful to achieve an output frequency range of 2:1 meaning that the output frequency can vary from×hertz to 2×hertz so that simple digital dividers can be used to multiply the total range by any factor. LC tank oscillators, for instance, have a frequency range of only approximately thirty percent. Interpolating delay oscillators achieve a frequency range of only 1.6:1. Thus, in the present designs, achieving a 2:1 frequency range requires greater size and circuit power than is desirable in many applications. Small circuit area, moreover, saves manufacturing costs and less power conserves battery life.

Figure 1:
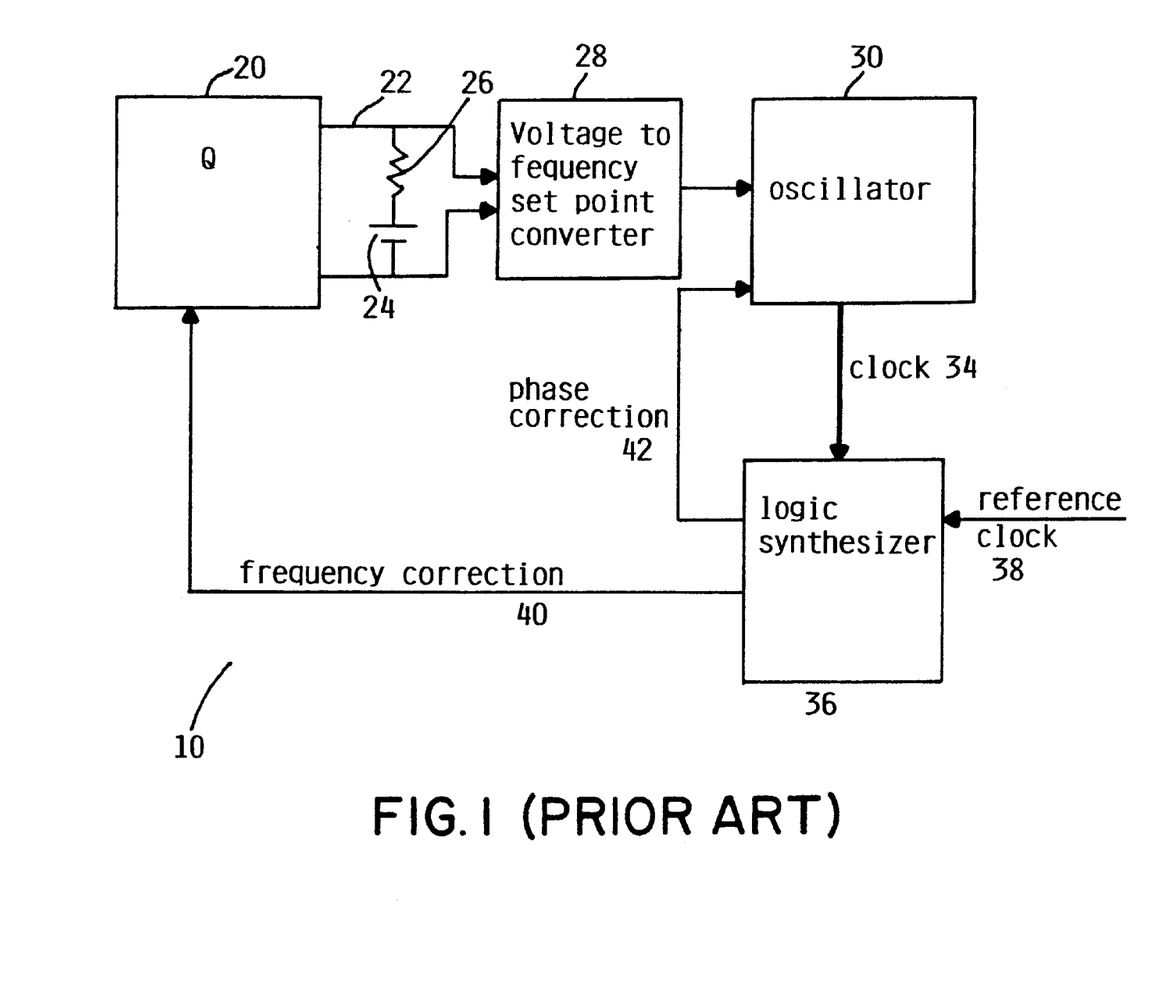
FIG. 1 is a simplified block diagram of a prior art PLL.

With respect to FIG. 1, a conventional phase-locked loop (PLL) 10 is shown. PLLs are a broad category of circuits that lock the frequency and phase of an electronic data stream to a system clock. The PLL comprises conventional elements such as a charge pump 20 and a loop filter 22. Loop filter 22 comprises a capacitor 24 and a resistor 26 in series to achieve rapid lock-in of the appropriate frequency. The voltage across the loop filter 22 is provided to a voltage-to-frequency set point converter 28 which provides a voltage to the oscillator 30 to generate a signal having a frequency proportional to the input voltage from the voltage-to-frequencesy converter 28. There are many types of oscillators 30 that can be used in the PLL to generate the system clock, and ring oscillators, multivibrators, and LC tank oscillators are just three types of clock generators for PLLs. The output from the oscillator 30 is a clock signal 34 of a selected frequency which is input to the logic synthesizer 36. The logic synthesizer 36 monitors the frequency of the clock signal 34 and determines if the frequency is too fast or too slow with respect to a reference clock 38. The output of the logic synthesizer 36 adjusts the charge pump 20 and the voltage-to-frequency converter 28 accordingly with a frequency correction signal 40 and a phase correction signal 42, if available. There is, however, a charge-up time of the timing loop capacitor 24 so that after its capacitor 24 charges, the clock frequency 34 changes slightly. A disadvantage of this PLL is the large area required for the charge pump capacitor 24.

Figure 2:
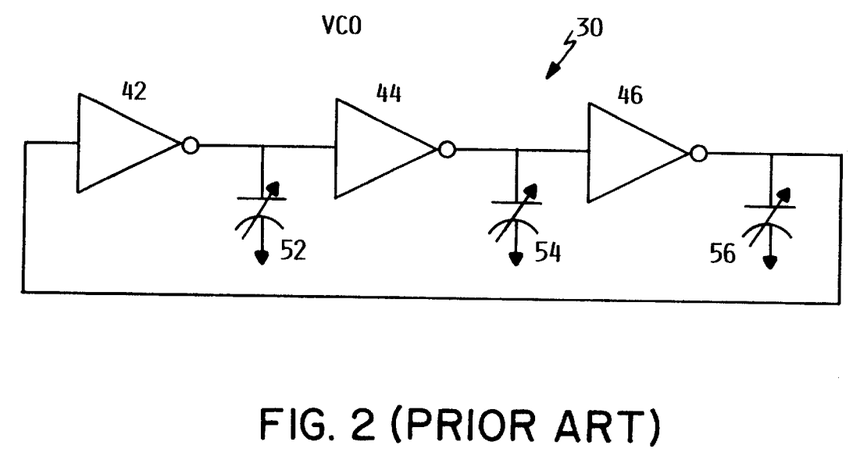
FIG. 2 is a simplified block diagram of a ring oscillator having three delay stages, as in the prior art.

FIG. 2 shows a typical ring voltage controlled oscillator 30 in which a number of delay stages 42, 44, 46 drive each other in a ring to achieve oscillation. Load capacitors 52, 54, 56 on the output of each delay stage can be varied to tune the ring, as in U.S. Pat. No. 5,191,301 entitled Integrated Differential Voltage Controlled Ring Oscillator to Mullgrav issued Mar. 2, 1993, assigned to the same assignee as this application and herein incorporated by reference in its entirety. The frequency of oscillation can be stated as: $F=\frac{1}{2}[N(T_d+T_c)]^{-1}$ where $T_d$ is the fixed time delay per stage which represents the wiring and parasitic capacitance; $T_c$ is the capacitor variable time delay per stage; and N is the number of delay stages 42, 44, 46. $T_c$ varies as the capacitance values of capacitors 52, 54, 56 are varies. In this arrangement, large tuning ranges can be achieved with large capacitor variations. In order to get a 2:1 frequency range, $T_c$ must be equal to $T_d$, i.e., for each stage, the fixed time delay must be equal to the variable time delay. As $T_c$ is increased, however, the fixed delay, $T_d$, also increases; thus, to achieve a larger frequency range, a larger capacitance is required generating more circuit area and more input and dissipative power.

Figure 3:
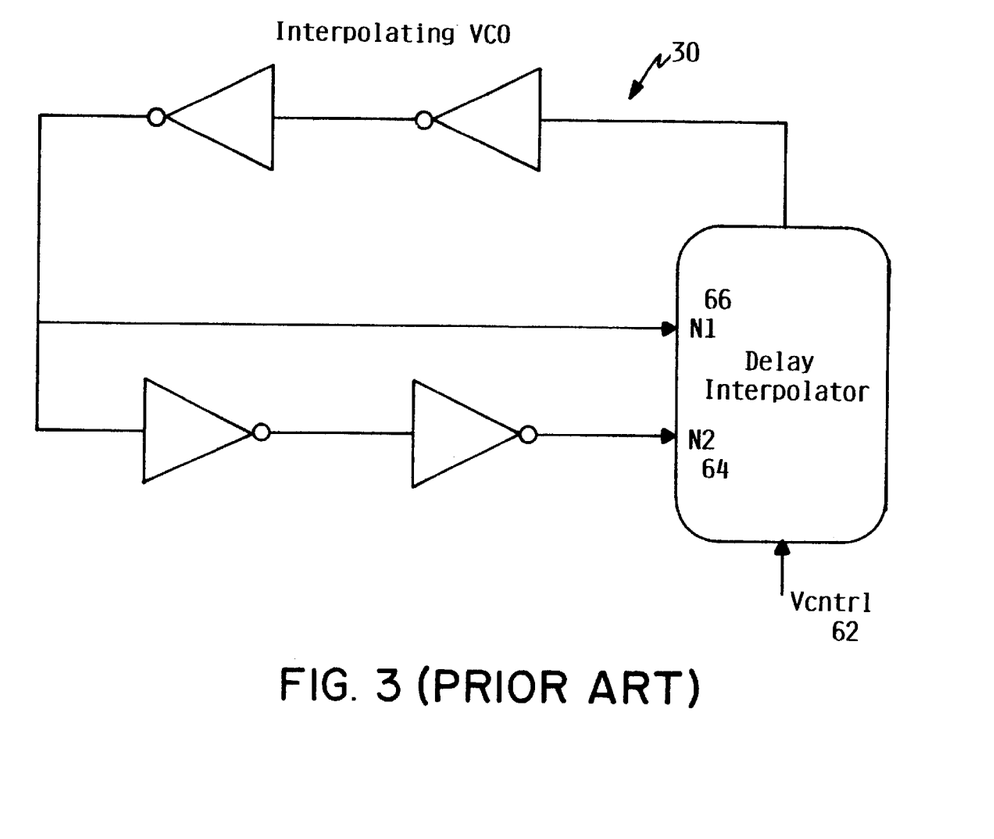
FIG. 3 is a simplified block diagram of a delay interpolation ring oscillator having delay paths as in the prior art.

FIG. 3 shows a typical delay interpolation tuning ring oscillator 30. As the control voltage 62 changes, the delay interpolator adds or interpolates the delay from two different delay paths 64, 66. If the control voltage 62 chooses more of the N1 path 66 input, the frequency is increased. If the control voltage 62 chooses more of the N2 path 64 input, the frequency is decreased. Mathematically, the frequency of oscillation is: $F=\frac{1}{2}[T_d(KN1+(1-K)N2)]^{-1}$ where $T_d$ is the fixed time delay per stage, N1 is the equivalent number of delay stages for the short path 66; N2 is the equivalent number of delay stages for the long path 64; and K is an interpolation variable. As an example, if N1=3 and N2=5, and K varies between 0 to 1 based on the control voltage, the oscillation frequency varies by a factor of 5/3. Theoretically, however, the total frequency range cannot vary by more than 1.6:1 for a single interpolation stage. In order to achieve a greater than 2:1 frequency range, the delay interpolation circuit can be cascaded. The disadvantage of cascading, however, is increased circuit size and power.

Thus, each of the techniques above require more circuit elements and more power to achieve a greater frequency range. There remains a need in the industry to achieve a frequency ratio greater than 2:1 while minimizing the area required and the circuit power. There is a further need in the industry to simplify a method to maintain constant fine tune frequency control gain of ring VCOs.

SUMMARY OF THE INVENTION

These needs and other are met by an embodiment of the present invention, herein disclosed as a dual-control ring voltage controlled oscillator, comprising a delay interpolator connected to at least a short path and a long path; each of the paths having a plurality of delay stages at the output of the delay interpolator with the short path having fewer delay stages than the long path; a plurality of variable capacitors interspersed among the plurality of delay stages; an input coarse tune code to vary the capacitance of the plurality of variable capacitors; and an input fine tune code to vary an interpolation variable thereby interpolating the delay through the short path and/or long path. The dual control ring voltage controlled oscillator has an output frequency range of at least two to one.

The dual-control ring voltage controlled oscillator may further comprise a coarse tune digital-to-analog converter to generate a coarse tune current input into the delay interpolator in response to the coarse tune code; and a fine tune digital-to-analog converter to generate a fine tune current input into the delay interpolator in response to the fine tune code; the sum of the coarse tune current and the fine tune current being the control current input to the delay interpolator.

The coarse tune code comprises an A code input to each of the plurality of variable capacitors and a B code input to the coarse tune digital-to-analog converter.

The dual control ring voltage controlled oscillator may further comprises a second plurality of phase tune variable capacitors connected between each of the plurality of delay stages in the at least short and/or long path with a coarse tune phase code to vary the capacitance of the second plurality of phase tune variable capacitors, and a fine tune phase digital-to-analog converter to provide a phase tune current into the delay interpolator; the control current input to the delay interpolator being the sum of the coarse tune current, the fine tune current, and the phase tune current.

The oscillator may also comprise a logic synthesizer which receives the output of the last delay stage and the last variable capacitor of the at least short and/or long path and in response thereto generates the tune codes.

In another embodiment of the invention, a dual-control ring voltage controlled oscillator comprises a delay interpolator connected to at least a short path and a long path; the paths having a plurality of delay stages at the output of the delay interpolator with the short path having fewer delay stages than the long path; a plurality of variable capacitors interspersed among the plurality of delay stages; an input coarse tune code comprising an A code to vary the capacitance of the plurality of variable capacitors, and a B code input to a coarse tune digital-to-analog converter to generate a coarse tune current input into the delay interpolator to vary an interpolation variable thereby interpolating the delay through at least the short path and/or long path. There is also an input fine tune code to a fine tune digital-to-analog converter to generate a fine tune current input into the delay interpolator to further vary the interpolation variable to more finely tune the oscillator. There is a second plurality of phase tune variable capacitors connected between each of the plurality of delay stages in the at least short and/or long path, and a respective coarse tune phase code to vary the capacitance of the second plurality of phase tune variable capacitors, and a fine tune phase digital-to-analog converter to provide a phase tune current into the delay interpolator, the control current input to the delay interpolator being the sum of the coarse tune current, the fine tune current, and the phase tune current. This embodiment of the invention further comprises a logic synthesizer which receives the output of the last delay stage and the last variable capacitor of the at least short and/or long path and in response thereto generates the tune codes. The oscillator of this embodiment also has an output frequency range of at least two to one.

The invention may further be considered a method to tune a ring voltage-controlled oscillator, comprising the steps of inputting a capacitor tune code to vary the capacitance of a plurality of delay elements of a plurality of delay paths within a ring voltage-controlled oscillator; inputting a digital coarse tune code to select a first interpolation variable interpolating the delay between from the plurality of delay paths that a signal will traverse; and inputting a digital fine tune code to generate a second interpolation variable further interpolating delay from each of the plurality of delay paths to fine tune a frequency output by the voltage-controlled oscillator.

The tuning method may further comprises inputting a coarse phase tune code to vary the capacitance of a delay ring, and inputting a digital fine phase tune code to fine tune the frequency output by the voltage-controlled oscillator.

The invention may also be considered a dual-control ring voltage-controlled oscillator, comprising means to input an oscillating signal into a ring oscillator; means to provide at least two delay paths for the oscillating signal; means to vary the delay in at least two delay paths; and means to interpolate the at least two delay paths. The means to vary the delay in the at least two delay paths may comprise a means to vary the capacitance of a plurality of capacitive elements on the at least two delay paths. The means to interpolate the at least two delay paths may also further comprise a means to provide a coarse tune interpolation code for coarse tuning of the oscillator; and a means to provide a fine tune interpolation code for fine tuning of the oscillator. The oscillator may further comprise a means to tune the phase of the oscillating signal using the means to vary the delay in the at least two delay paths and the means to interpolate the at least two delay paths. The oscillator may yet further comprise a means to provide feedback to the means to input the oscillating signal, and in response to the feedback, the means to vary the delay, the means to interpolate, and the means to tune the phase achieve an accurate frequency range greater than 2:1.

The recitation herein of a list of inventive features which are met by various embodiments of the present invention is not meant to imply or suggest that any or all of these features are present as essential or necessary features, either individually or collectively, in the most general embodiment of the present invention or in any of its more specific embodiments.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 4:
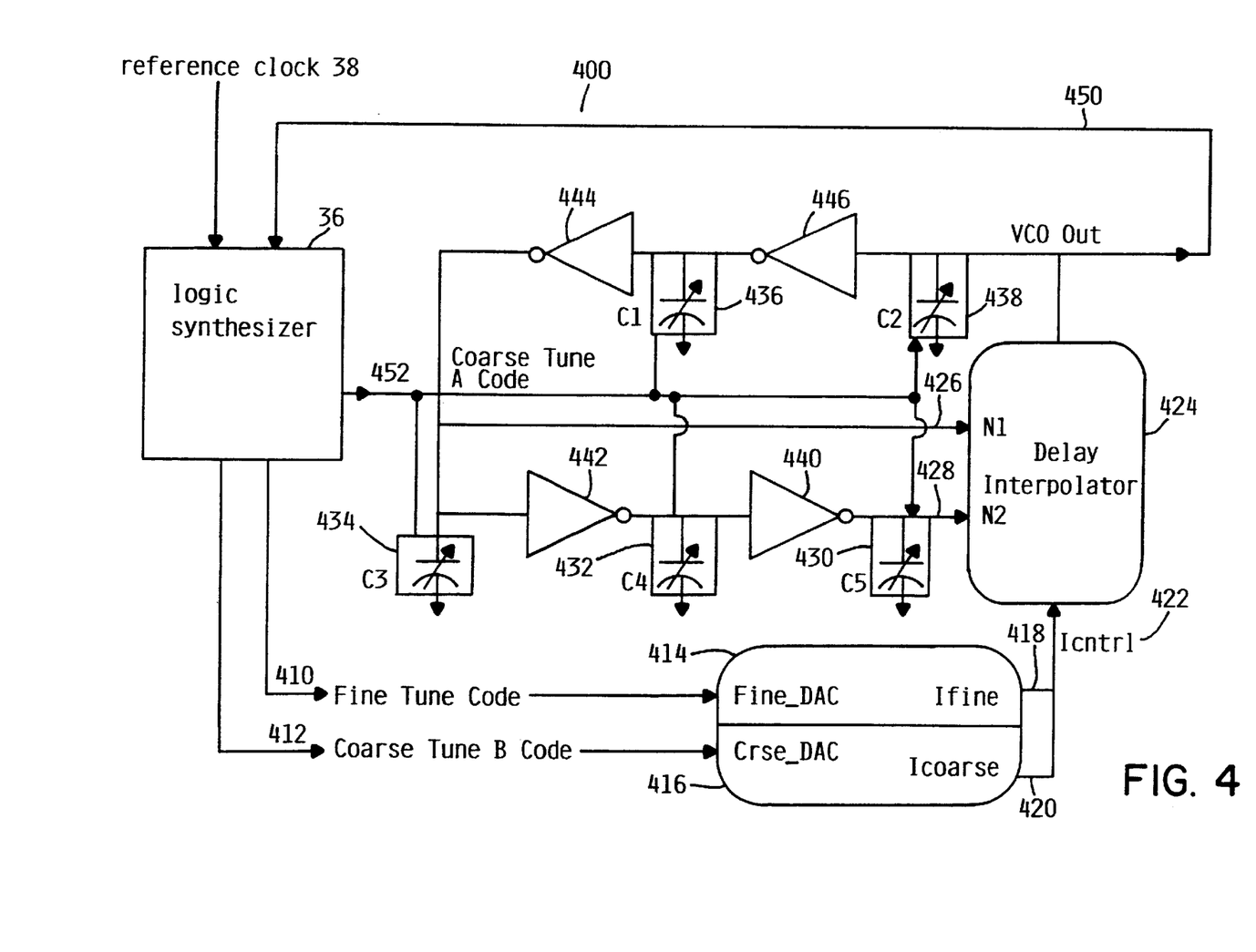
FIG. 4 is a simplified block diagram of a dual-control ring VCO in accordance with principles of the invention. It is suggested that FIG. 4 be printed on the face of the patent.

With reference to FIG. 4, there is shown a simplified circuit block diagram of a dual-control ring VCO 400 with variable delay capacitive and interpolative loads in accordance with one aspect of the invention. The dual-control ring VCO 400 comprises a delay interpolator 424 having an input control current 422 and two output paths: a short output path 426 and a longer output path 428. Of coarse, there may be more than two delay paths having the same or different number of delay stages. The input control current 422 is the sum of two currents: (1) Ifine 418 for fine or more sensitive frequency adjustment; and (2) Icoarse 420 for coarse frequency adjustment. Ifine 418 is output from a fine-tune digital-to-analog converter (DAC) 414 controlled by a fine tune code 410; and Icoarse 420 is output from a coarse-tune DAC 416 controlled by a coarse tune B code 412.

The short output path 426 comprises a number N1 of delay stages 444 446, each of which are followed by a respective tuning capacitor 436, 438. The long output path 428 has N2 delay stages which includes N1 delay stages and delay stages 440 and 442 interspersed with tuning capacitors 430, 432, and 434. The number of delay stages in each of the paths will vary according to the application but in general, the fewer delay stages the better. Fewer delay stages means less power, less chip area, and less delay which translates to a faster frequency. Fewer stages, however, also means that the gain and bandwidth of each stage needs to be higher to sustain oscillation because the gain must be greater than one for all conditions. Achieving more gain and bandwidth takes more power and area.

Dual control is achieved by the use of several signals output from the logic synthesizer 36. The coarse tune A 452 input directly to the variable capacitors 430, 432, 434, 436, and 438, and the coarse tune B code 412 through the coarse digital-to-analog converter 416 to generate a current Icoarse 420 which determines which of the paths will be selected to generate the clock frequency 450. The fine tune code 410 input in the fine digital-to-analog converter 414 which generates the current Ifine 418 adjusts the interpolation variable K, which, in turn, adds or interpolates the delay from the two or more different delay paths. The tune codes 410, 412, and 452 are generated by the logic synthesizer 36 in response to the frequency clock output 450 from the dual-controlled VCO.

The output frequency 450 from the dual-control ring VCO 400 can be mathematically represented as:

$$F = \frac{1}{2(T_d + T_c)(KN1 + (1-K)N2)}$$

where F is the frequency of oscillation, $T_d$ is the fixed time delay per stage of, inter alia, the wiring and parasitic capacitance, $T_c$ is the capacitor variable time delay per stage and is dependent upon the coarse tune A code 452, N1 is the equivalent number of delay stages for the short path 426, N2 is the equivalent number of delay stages for the long path 428, and K is the interpolation variable controlled by the control current 422 which is varied by both the fine tune code 410 and the coarse tune B code 412. Preferably $T_d$, the fixed time delay per stage, and $T_c$, the variable capacitance time delay per stage, are substantially equal to the values of $T_d$ and $T_c$ of the other stages, i.e., the $T_d$ of stage 1 would be equal to the $T_d$ of stage 2, and the $T_c$ of stage 1 would be equal to the $T_c$ of stage 2, although the values may vary individually among the stages requiring more control. The delay can also be varied using a varying current, a load resistor of variable resistance, or changing the gain so long as the circuit continues to oscillate. One of skill in the art will realize that there are other circuit elements and techniques that can be used to vary the capacitive loading of the dual-controlled VCO herein.

Many VCO applications having large tuning ranges require a coarse tune mode where the change in frequency is large per step size to lock onto a general frequency range and a fine tune mode where the change in frequency movement is small per step size to lock more accurately. The advantage of a coarse tune and a fine tune mode is it allows more accurate tuning regardless of the selected frequency, process variation, temperature change, and voltage supply movement. To adjust the dual-control ring VCO, preferably a coarse tune adjustment is done first followed by a fine tune adjustment.

Figure 5:
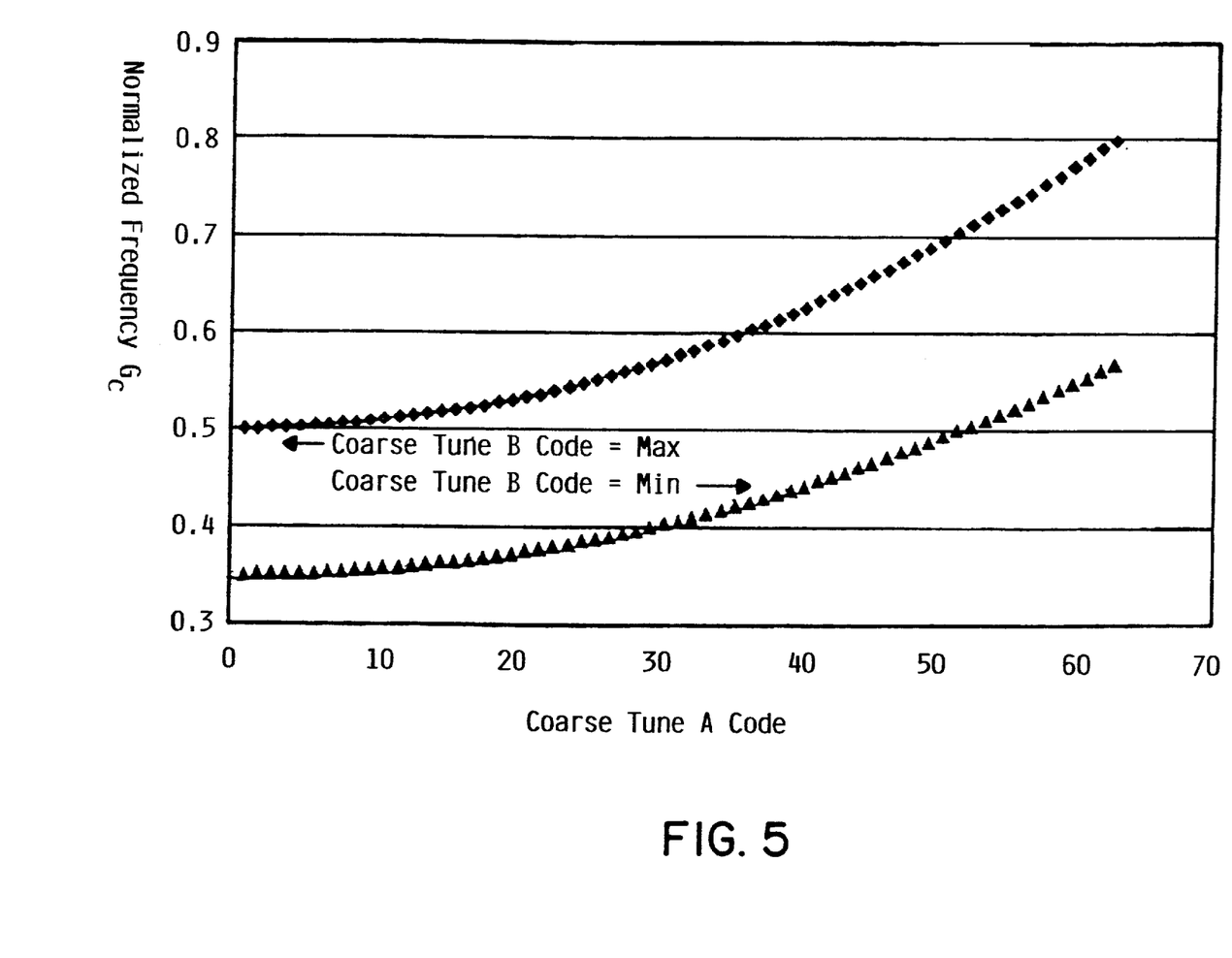
FIG. 5 is a graph depicting the normalized frequency output of the dual-control ring VCO as a function of the coarse tune A code in accordance with an embodiment of the invention.

Coarse tune adjustment uses a dual-control method to vary the capacitance of the circuit elements and to interpolate among the available delay paths of the circuit. The logic synthesizer 36 receives the output frequency 450 of the dual-control ring VCO and compares it to the reference clock 38. In response, if the output frequency 450 is too fast or too slow, the logic synthesizer 36 adjusts the coarse tune bit codes 452 and 412 until the output frequency 450 is within the range that can be further adjusted by the fine tune aspects of the invention. Coarse tune adjustment is achieved using output bits from the logic synthesizer 36 for the coarse tune A code 452 which coarsely adjusts the capacitive delay of the selected path, and the coarse tune B code 412 which coarsely adjusts the delay interpolator variable K to select delays from each path. FIG. 5 is a graph of a frequency output versus the coarse tune A code 452 when binary weighted capacitors are used for the coarse tune to vary $T_c$. The two different lines on FIG. 5 represent two different values of the interpolation variable K which is changed using coarse tune B code 412. In the examples shown in FIG. 5, the coarse tune A code 452 from the logic synthesizer 36 is a six bit digital number having a decimal equivalent that will the vary 0 to 63. Of coarse, more or fewer bits can be used to achieve a larger or smaller number for coarser or finer control. For larger values of coarse tune A code 452, the load capacitance is reduced thus making $T_c$ smaller which allows the normalized frequency to increase. The coarse tune B code is a one bit digital number and when the coarse tune B code=1, K=0.75; and when the coarse tune B code=0, K=0.25. Different values of the coarse tune B code and fine tune code can be used to generate different values of the interpolation variable K. Note that the dual-control method wherein both the capacitance of the delay elements and the interpolation of the several paths are varied to affect the output frequency 450 during coarse tuning results in frequency range greater than 2:1. The total frequency change is represented by the maximum of the coarse tune B code which in FIG. 5 is 0.8 divided by the minimum of the coarse tune B code which is 0.35 such that 0.8/0.35=2.29. Adjusting the capacitive delay by adjusting the variable capacitor with the coarse tune A code 452 only without the capability to adjust the interpolation variable K would limit the frequency range to 0.8/0.5 or 1.6:1. Varying the interpolation variable K alone without also adjusting the variable capacitive delay requires much greater less power and circuit area. Thus, the dual-control method and its implementation circuit achieve a greater range of output frequency with less power and area than if either the interpolation method or the variable capacitor method were used alone.

It is desirable to avoid large variations in the percent change of normalized frequency per code Gc for any VCO used in closed loop systems unless the system has a relatively slow feedback time constant during coarse tuning. If the change of frequency per change of input code is too great, then it may not be possible to lock onto the reference frequency because by adding another step, the frequency of interest may be skipped and the resolution provided by the fine tune code may not be sufficient to lock onto the frequency. The invention provides a range with which to vary the frequency step per increase/decrease of the input code and because coarse tuning can be done slowly, at for instance, the power up of the circuit, the dual method will not be affected by a large variation in Gc. For the example shown in FIG. 5, Gc=0.1% per code for low values of coarse tune A code, and Gc=1.2% per code at large values of coarse tune A code.

Figure 6:
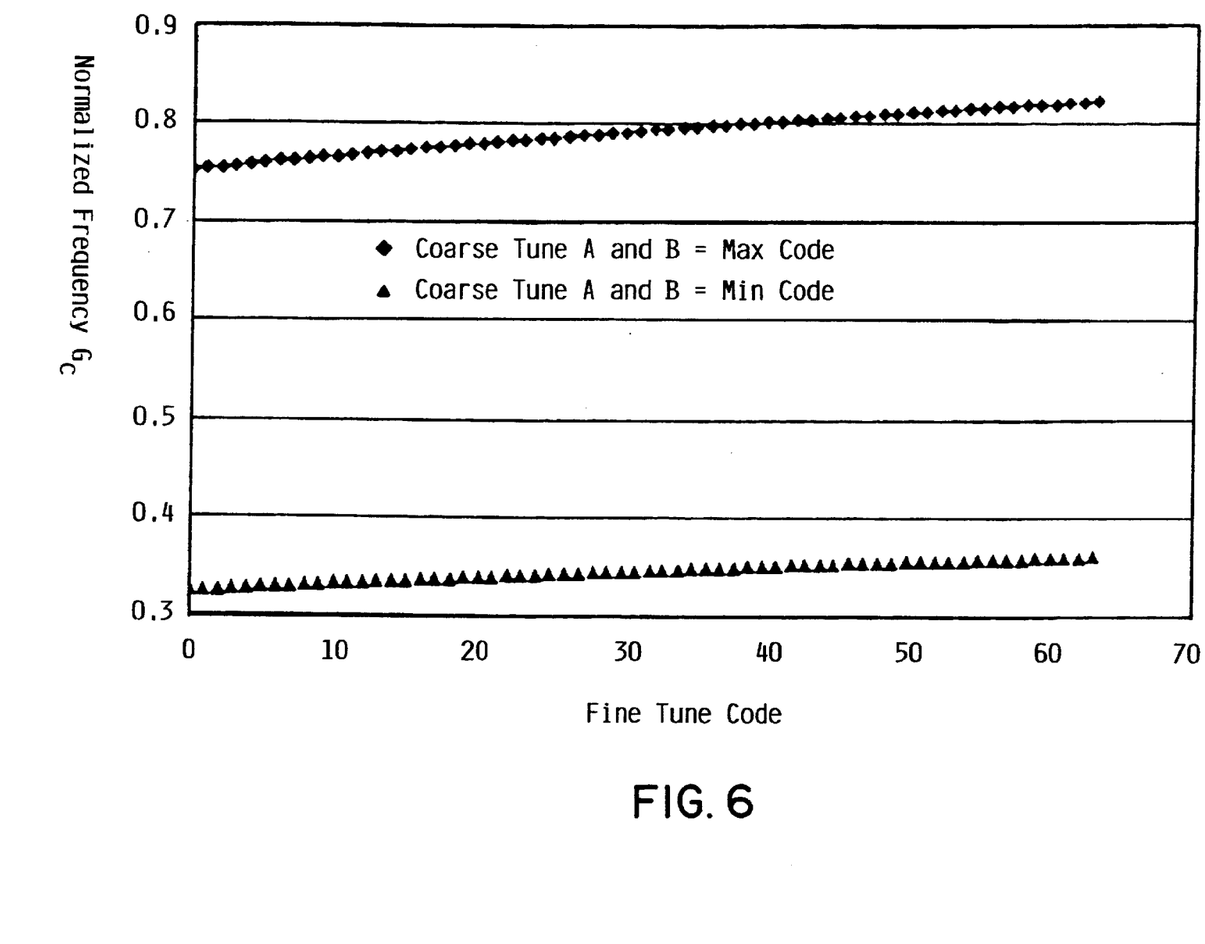
FIG. 6 is a graph depicting the normalized frequency output of the dual-control ring VCO as a function of the fine tune code in accordance with an embodiment of the invention.

Once coarse tuning is done, fine tuning tightly controls the frequency to adjust for temperature and power supply variations in an integrated circuit. FIG. 6 shows the frequency change versus fine tune code for minimum and maximum coarse tune A and B code. For example, at the maximum when coarse tune A code=63 and coarse tune B code=1, the oscillation frequency is centered around a normalized frequency of 0.8 for the fine tune code variation of 0 to 63. Likewise, at the minimum when coarse tune A code=0 and coarse tune B code=0, the oscillation frequency is centered around a normalized frequency of 0.35 for the fine tune code variation of 0 to 63. Notice the normalized frequency is nearly linear across the fine tune code range for a given coarse tune code, but there is nearly a 2:1 difference in the slope between the minimum and maximum cases shown in FIG. 6.

The linearity of the normalized frequency change per code slope Gf during fine tune operation is dependent on the structure of the interpolator circuit, one of which is presented in U.S. Pat. No. 5,789,989 entitled Delay Interpolating Voltage-Controlled Oscillator with Linear Transfer Function to Paschal et al. issued Aug. 4, 1998, assigned to the same assignee as this application and herein incorporated by reference in its entirety. The interpolator circuit of Paschal et al. adds considerable circuitry and power if a higher frequency range is to be achieved. A simpler and preferred method in accordance with principles of the invention to make the slopes more equal is to change the code step size of the fine tune DAC 414 based on the coarse tune code B. For example, the slope Gf is 0.11% per fine-tune DAC code when coarse tune B is one; and Gf=0.057% per fine-tune DAC code when coarse tune B is zero. Making a correction to one least significant bit of the fine tune code 410 (the top line of FIG. 6) results in a 0.11% frequency change; whereas making a correction to the two least significant bits in the fine tune code 410 (as in the bottom line of FIG. 6) results in the 0.114% frequency change, only a 3.6% difference. A smaller slope value indicates more accurate control of the frequency when the least significant bits of the DACs are changed which is particularly beneficial to a closed loop system if the correction gain of the VCO is relatively constant and where only a small DAC step size change is needed to maintain a constant loop gain. The Gf during fine tune is relatively independent of the coarse tune A code so the DAC step size need only change depending on the state of the coarse tune code B.

Figure 7:
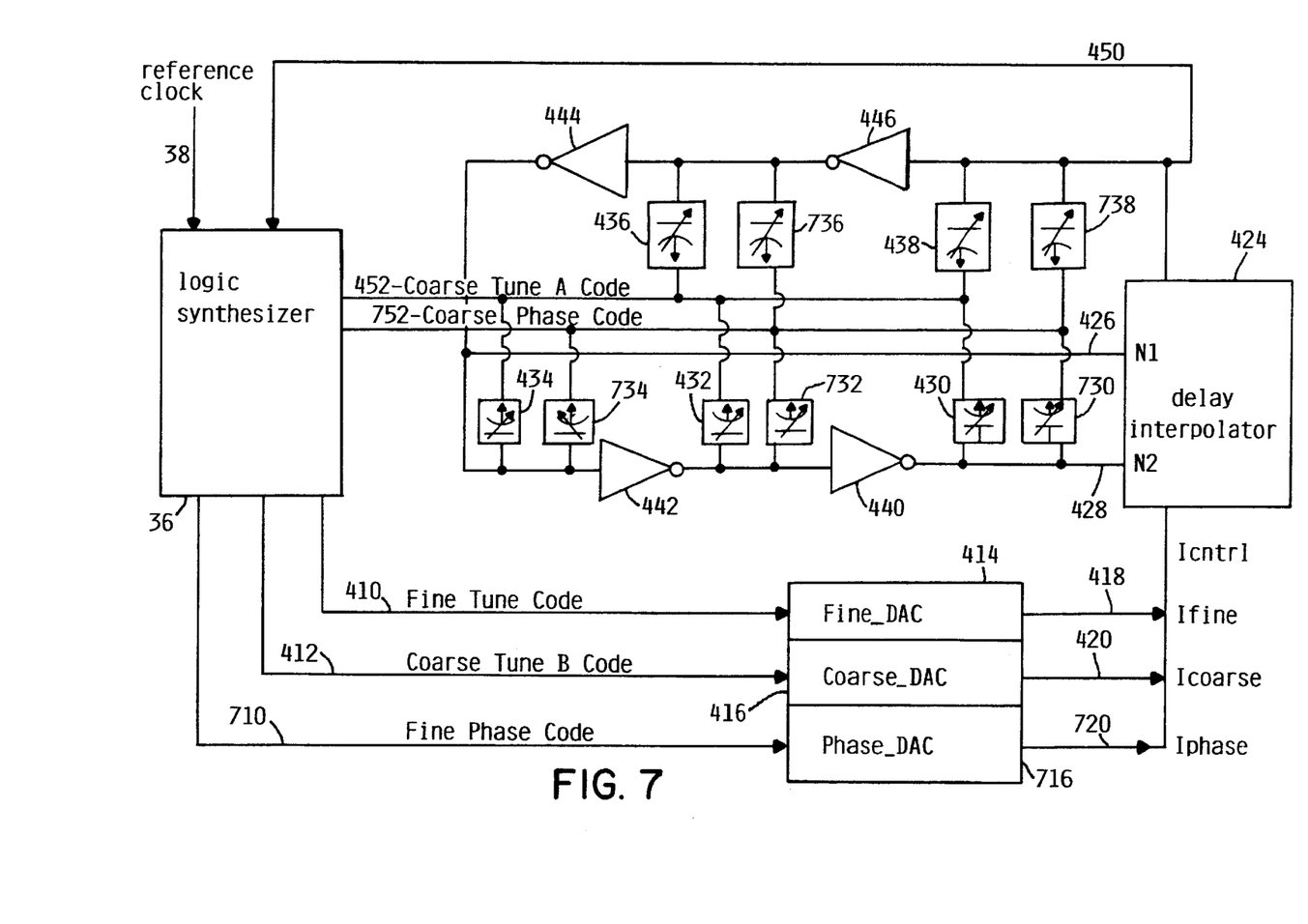
FIG. 7 is a simplified block diagram of the dual-control ring VCO having phase adjustment in accordance with principles of the invention.

The dual-control tuning features of the invention can also be used in a phase locked loop system for both frequency and phase control. Two general methods of changing the phase can be adapted to this invention: a method to change the phase in the fine tune mode and a method to change the phase in the coarse tune mode. FIG. 7 shows the circuit as described as in FIG. 4 but now incorporating fine and coarse phase adjustment control. Variable capacitors 730, 732, 734, 736, 738 are adjusted by the coarse phase code 752 input from the logic synthesizer 36. The fine phase control is maintained by input current Iphase 720 as the output of a phase DAC 716 which is adjusted by the fine phase code 710 from the logic synthesizer 36. The interpolation control current 422 is now described as: I(control)=Ifine+I coarse+Iphase where Ifine is the fine tune current 418 for frequency control; I coarse is the coarse tune current 420 for frequency control, and Iphase is the phase adjust current 720. The oscillation frequency can be mathematically represented as:

$$F = \frac{1}{2(T_d + T_c + T_p)(KN1 + (1 - K)N2)}$$

wherein $T_d$ is the fixed time delay per stage, $T_c$ is the capacitor variable time delay per stage for coarse tune, $T_p$ is the capacitor variable time delay per stage from the capacitors 730 through 738 for phase control, N1 is the equivalent number of delay stages for the short path 426, N2 is the equivalent number of delay stages for the long path 428, and K is the interpolation variable controlled by the control current 422. Note that $T_p$ is the only addition to the previous equation.

Figure 8:
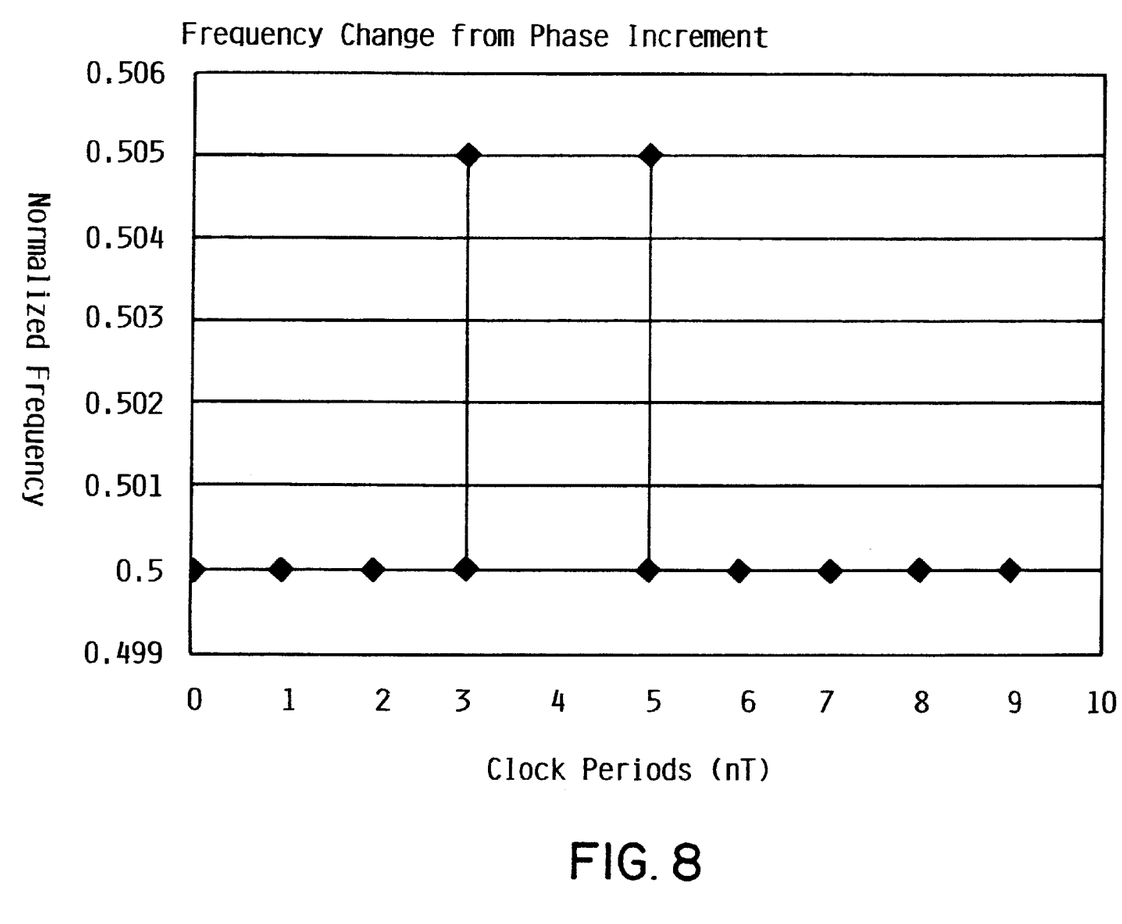
FIG. 8 is a graph depicting the normalized frequency output of the dual-control ring VCO as a function of the clock periods of a dual-control ring VCO in accordance with principles of the invention.
Figure 9:
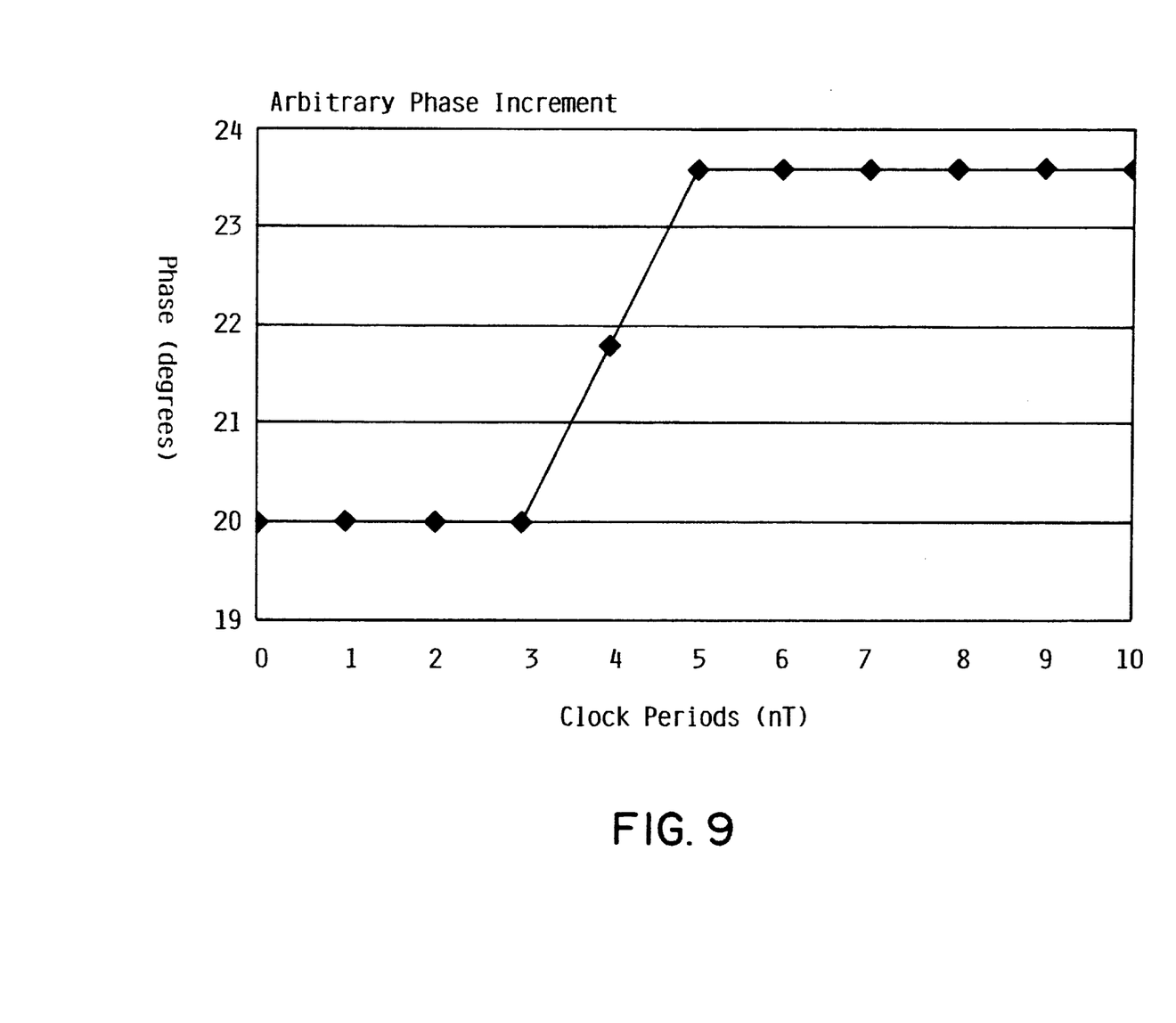
FIG. 9 is a graph depicting the change of frequency as a function of the clock periods of the dual-control ring VCO in accordance with principles of the invention.

A temporary change in the frequency will result in a phase shift of the oscillator signal. FIG. 8 show an ideal example of the frequency increasing for two clock periods by one percent. FIG. 9 shows the resulting change in the phase which was arbitrarily started at 20 degrees and shifted higher to 27.2 degrees (2% of 360 degrees is 7.2 degrees). The technique of adjusting phase is well known but can be easily adapted to this invention using fine phase and coarse phase adjustments.

Similar to the frequency adjustment, once the coarse phase adjustment has been accomplished, the fine phase adjustment can be changed with fine phase code bits having at least three states, (1) an increment; (2) decrement; and (3) no phase adjustment. For example, a 0.5% phase adjustment would result if the fine phase code was held on for two clock periods and the frequency gain change per phase code Gp was 0.25%. The amount of phase shift in fine tune mode can be changed by allowing the fine phase code to stay active longer or shorter, or changing Iphase depending on the state of coarse tune B code. Preferably, the ratio of Iphase to the sum of Ifine and Icoarse remains relatively equal when coarse tune B code changes to maintain a constant Gp.

For larger coarse phase adjustments, the load capacitors for each delay stage can be adjusted. Decreasing the capacitance for a finite amount of time, e.g., one or more clock periods, will increase the frequency for a finite amount of time which adjusts the phase. The coarse phase code bits must have at least three states as well: (1) an increment; (2) decrement; and (3) a no-phase adjustment state. Because the coarse phase capacitance, Cp, relative to the total capacitance of each delay stage, Ct will vary with for each tune A code amount, it is preferable to adjust Cp to keep the ratio of Cp to Ct relatively equal for each coarse tune amount.

The invention is not limited to capacitor tuning to vary $T_c$ during frequency coarse tune. Other methods exist to vary $T_c$, such as bias current variation on each delay cell instead of or in conjunction with capacitor tuning. Also different code sizes can be used for coarse tune A and B and fine tune, and different circuit configurations for interpolation delay can be used as well. Because fine tune operation is primarily used for temperature and power supply movements, the full fine tune range of frequency movement should cover these changing parameters. The delay cell design will determine how much fine tune range is actually needed. If less fine tune range is needed, more of the interpolation variable K can be used for coarse tune operation. Likewise if more fine tune range is needed, less of the interpolation variable K can be used for coarse tune operation. Finally, the invention is capable of using phase adjustment techniques in fine tune and/or coarse tune modes for systems requiring phase adjustments. Thus, the size and power of the circuit is substantially reduced and the relatively simpler method of maintaining constant fine tune Gf of the VCO.

In integrated semiconductor applications, this voltage source is on the order of 1.8 volts or 1.5 volts but may be greater or less depending upon the application which is not limited to integrated semiconductor applications.

The invention may be realized using n-type and p-type semiconductor technology. In addition, the dual-controlled voltage controlled oscillator as described above may be implemented in CMOS or silicon-on-insulator (SOI).

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A dual-control ring voltage controlled oscillator, comprising:
   (a) a delay interpolator connected to at least a short path and a long path;
   (b) a plurality of delay stages at the output of the delay interpolator along each of the at least short path and long path, the short path having fewer delay stages than the long path;
   (c) a plurality of variable capacitors interspersed among the plurality of delay stages;
   (d) an input coarse tune code to vary the capacitance of the plurality of variable capacitors; and
   (e) an input fine tune code to vary an interpolation variable thereby interpolating the delay through at least the short path and/or long path.

2. The dual-control ring voltage controlled oscillator of claim 1, further comprising:
   (a) a coarse tune digital-to-analog converter to generate a coarse tune current input into the delay interpolator in response to the coarse tune code;
   (b) a fine tune digital-to-analog converter to generate a fine tune current input into the delay interpolator in response to the fine tune code;
   wherein the sum of the coarse tune current and the fine tune current is the control current input to the delay interpolator.

3. The dual-control ring voltage controlled oscillator of claim 2, wherein the coarse tune code comprises an A code input to each of the plurality of variable capacitors and a B code input to the coarse tune digital-to-analog converter.

4. The dual control ring voltage controlled oscillator of claim 3 having an output frequency range of at least two to one.

5. The dual control ring voltage controlled oscillator of claim 3, further comprising:
   (a) a second plurality of phase tune variable capacitors connected between each of the plurality of delay stages in the at least short and/or long path;
   (b) a coarse tune phase code to vary the capacitance of the second plurality of phase tune variable capacitors;
   (c) a fine tune phase digital-to-analog converter to provide a phase tune current into the delay interpolator; the control current input to the delay interpolator being the sum of the coarse tune current, the fine tune current, and the phase tune current.

6. The dual-control ring voltage controlled oscillator of claim 3, further comprising a logic synthesizer which receives the output of the last delay stage and the last variable capacitor of the at least short and/or long path and in response thereto generates the tune codes.

7. A dual-control ring voltage controlled oscillator, comprising:
   (a) a delay interpolator connected to at least a short path and a long path;
   (b) a plurality of delay stages at the output of the delay interpolator along each of the at least short path and long path, the short path having fewer delay stages than the long path;
   (c) a plurality of variable capacitors interspersed among the plurality of delay stages;
   (d) an input coarse tune code comprising an A code to vary the capacitance of the plurality of variable capacitors, and a B code input to a coarse tune digital-to-analog converter to generate a coarse tune current input into the delay interpolator to vary an interpolation variable thereby interpolating the delay through at least the short path and/or long path;
   (e) an input fine tune code to a fine tune digital-to-analog converter to generate a fine tune current input into the delay interpolator to vary an interpolation variable thereby interpolating the delay through at least the short path and/or long path;
   (f) a second plurality of phase tune variable capacitors connected between each of the plurality of delay stages in the at least short and/or long path;
   (g) a coarse tune phase code to vary the capacitance of the second plurality of phase tune variable capacitors;
   (h) a fine tune phase digital-to-analog converter to provide a phase tune current into the delay interpolator, the control current input to the delay interpolator being the sum of the coarse tune current, the fine tune current, and the phase tune current; and
   (i) a logic synthesizer which receives the output of the last delay stage and the last variable capacitor of the at least short and/or long path and in response thereto generates the tune codes;
   wherein the oscillator has an output frequency range of at least two to one.

8. A method to tune a ring voltage-controlled oscillator, comprising the steps of:
   (a) inputting a capacitor tune code to vary the capacitance of a plurality of delay elements of a plurality of delay paths within a ring voltage-controlled oscillator;

(b) inputting a digital coarse tune code to select a first interpolation variable interpolating the delay between from the plurality of delay paths that a signal will traverse; and (c) inputting a digital fine tune code to generate a second interpolation variable further interpolating delay from each of the plurality of delay paths to fine tune a frequency output by the voltage-controlled oscillator.

9. The method of claim 8, wherein further comprising:

(a) inputting a coarse phase tune code to vary the capacitance of a delay ring; and (b) inputting a digital fine phase tune code to fine tune the frequency output by the voltage-controlled oscillator.

10. A dual-control ring voltage-controlled oscillator, comprising:

(a) means to input an oscillating signal into a ring oscillator;

(b) means to provide at least two delay paths for the oscillating signal;

(c) means to vary the delay in at least two delay paths; and (d) means to interpolate the at least two delay paths.

11. The dual-control ring voltage-controlled oscillator of claim 10 wherein the means to vary the delay in the at least two delay paths further comprises means to vary the capacitance of a plurality of capacitive elements on the at least two delay paths.

12. The dual-control ring voltage-controlled oscillator of claim 11 wherein the means to interpolate the at least two delay paths further comprises:

(a) means to provide a coarse tune interpolation code for coarse tuning of the oscillator; and (b) means to provide a fine tune interpolation code for fine tuning of the oscillator.

13. The dual-control ring voltage-controlled oscillator of claim 12, further comprising means to tune the phase of the oscillating signal using the means to vary the delay in the at least two delay paths and the means to interpolate the at least two delay paths.

14. The dual-control ring voltage-controlled oscillator of claim 12, further comprising means to provide feedback to the means to input the oscillating signal, and in response to the feedback, the means to vary the delay, the means to interpolate, and the means to tune the phase achieve an accurate frequency range greater than 2:1.

* * * * *